United States Patent
Kim et al.

(10) Patent No.: US 6,747,302 B2
(45) Date of Patent: Jun. 8, 2004

(54) FERAM HAVING BLT FERROELECTRIC LAYER AND METHOD FOR FORMING THE SAME

(75) Inventors: Nam-Kyeong Kim, Seoul (KR); Seung-Jin Yeom, Seoul (KR); Woo-Seok Yang, Seoul (KR); Soon-Yong Kweon, Kyoungki-do (KR)

(73) Assignee: Hynix Semiconductor Inc., Kyoungbki-di (KR)

( * ) Notice: Subject to any disclaimer, the term of this patent is extended or adjusted under 35 U.S.C. 154(b) by 65 days.

(21) Appl. No.: 10/133,505

(22) Filed: Apr. 26, 2002

(65) Prior Publication Data

US 2002/0160542 A1 Oct. 31, 2002

(30) Foreign Application Priority Data

Apr. 27, 2001 (KR) ........................................ 2001-23075

(51) Int. Cl.$^7$ ........................ H01L 21/00; H01L 31/036; G11C 11/22
(52) U.S. Cl. ........................ 257/295; 438/3; 365/145
(58) Field of Search ........................ 438/3; 257/295, 257/296; 365/145

(56) References Cited

U.S. PATENT DOCUMENTS

| | | | |
|---|---|---|---|
| 5,426,075 A | 6/1995 | Perino et al. | |
| 5,519,566 A | 5/1996 | Perino et al. | |
| 5,683,614 A | 11/1997 | Boyle | |
| 5,877,062 A | 3/1999 | Horii | |
| 6,010,744 A | 1/2000 | Buskirk et al. | |
| 6,043,561 A | 3/2000 | Katori et al. | |
| 6,096,592 A | 8/2000 | Cho | |
| 6,114,199 A | 9/2000 | Isobe et al. | |

FOREIGN PATENT DOCUMENTS

| KR | 2000-0060014 | 10/2000 |
|---|---|---|
| WO | PCT-WO 00/38247 | 6/2000 |

OTHER PUBLICATIONS

T.W. Noh et al., "A New Ferroelectric Material for Use in FRAM: Lanthanum–substituted Bismuth Titanate", 2000, Applications of Ferroelectrics, 2000. ISAF 2000. Proceedings of the 2000 12$^{th}$ IEEE International Symposium on, p. 237–242 vol. 1.*
K. Itoh et al., "Reviews and Prospects of High–Density RAM Technology", Semiconductor Conference, 2000. CAS 2000 Proceedings. International, p. 13–22 vol. 1.*
B.H. Park, "Lanthanum–substituted bismuth titanate for use in non–volatile memories", Nature, 401, 682 (1999).*
Araujo et al., "Fatigue–free ferroelectric capacitors with platinum electrodes", Nature, 374, 627 (1995).*
Notice of Preliminary Rejection issued from Korean Intellectual Property Office; dated Dec. 20, 2002 (3 pages).

* cited by examiner

Primary Examiner—Evan Pert
(74) Attorney, Agent, or Firm—Marshall, Gerstein & Borun LLP

(57) ABSTRACT

A ferroelectric memory device and a method for manufacturing the same is disclosed. Because a $(Bi_xLa_y)Ti_3O_{12}$ (BLT) layer, which can be crystallized in relatively low temperature, is used in a capacitor, the electrical characteristics of the ferroelectric capacitor can be improved. The method for manufacturing ferroelectric memory device includes the steps of forming a first conductive layer for a bottom electrode on a semiconductor substrate, forming the $(Bi_xLa_y)Ti_3O_{12}$ ferroelectric layer, wherein 'x' representing atomic concentration of Bi ranges from about 3.25 to about 3.35 and 'y' representing atomic concentration of La ranges from about 0.70 to about 0.90 and forming a second conductive layer for a top electrode on the $(Bi_xLa_y)Ti_3O_{12}$ ferroelectric layer.

18 Claims, 12 Drawing Sheets

FERAM HAVING BLT FERROELECTRIC LAYER AND METHOD FOR FORMING THE SAME

TECHNICAL FIELD

A ferroelectric random access memory (FeRAM), more particularly, a method for forming a FeRAM having a $(Bi_xLa_y)Ti_3O_{12}$ (BLT) ferroelectric layer is disclosed.

DESCRIPTION OF THE RELATED ART

A ferroelectric random access memory (FeRAM) is a nonvolatile semiconductor memory device with high integration of a dynamic random access memory (DRAM), a high speed information process of a static random access memory (SRAM) and an information storing function of a flash memory. As compared with a conventional flash memory and an electrically erasable programmable read only memory (EEPROM), a FeRAM has a relatively low operation voltage and its operation speed is 1000 times as fast as a flash memory or an EEPROM.

When voltage is applied to a DRAM capacitor, which includes a dielectric layer, such as a $SiO_2$ layer or a SiON layer, and then the voltage supply is terminated, the charges in the DRAM capacitor are discharged so that data stored in the DRAM are lost.

The ferroelectric material has two stabilized remnant polarization states.

Being different from the DRAM capacitor, the ferroelectric capacitor in the FeRAM maintains previously stored data by the remnant polarization of a ferroelectric material even if power supply is terminated.

The FeRAM device is similar to the DRAM device in that a transistor and a capacitor are connected to a word line and a plate line, respectively. However, the FeRAM device is different from the DRAM device in that a capacitor has a ferroelectric thin layer and the plate line is not connected to ground voltage or fixed voltage, e.g., ½ Vcc, and each cell is connected to a separate plate line so that power can be applied to the separate plate line on a cell-by-cell basis.

FIG. 1A is a circuit diagram illustrating a memory cell structure of a conventional FeRAM device including one transistor and one ferroelectric capacitor.

The transistor (Tr) includes a gate electrode connected to a word line (WL), a source and a drain, which are respectively connected to a bit line (BL) and a capacitor (C). The capacitor (C) includes a bottom electrode connected to a plate line (PL), a top electrode connected to the transistor (Tr) and a ferroelectric layer formed between the bottom electrode and the top electrode. The top electrode of the capacitor (C) functions as a charge storage electrode.

FIG. 1B is a cross-sectional view showing a FeRAM according to the prior art. A semiconductor substrate 10 including a field oxide layer 11 and a transistor having a gate insulating layer 12, a gate electrode 13 and source/drain 14, is provided. A first interlayer insulating layer 15 is formed on the semiconductor substrate 10 and an adhesive layer 16 in formed on the first interlayer insulating layer 15. A capacitor including a bottom electrode 17, a ferroelectric layer 18 and a top electrode 19 formed on the adhesive layer 16 are formed. A second interlayer insulating layer 20 is formed on the resulting structure. A first contact hole exposing the top electrode 19 of the capacitor and a second contact hole exposing the source/drain 14 formed on the semiconductor substrate 10 are formed. A metal diffusion barrier layer 21 with a stacked structure of Ti layer and TiN layer is layered and an interconnection line 22 connecting the top electrode of the capacitor with the source/drain of the transistor is formed.

FIG. 2 is a graph showing a hysteresis loop of a ferroelectric capacitor. In FIG. 2, positive voltage is defined when a potential of a bit line is higher than that of a plate line and remnant polarizations at points, "a" and "c", are defined to data "1" and "0", respectively.

If a transistor is turned on and positive voltage is applied to a plate line, then negative voltage applied to the ferroelectric capacitor and a charge variation is passing through point "d" in the hysteresis loop. After that, in case of turning the applied voltage to "0 V", polarization is going to the point "a" and the data "1" is stored. Meanwhile, when the data "0" is inputted, a positive voltage is applied to a ferroelectric capacitor and a charge variation is passing through point "b", and turning the applied voltage to "0 V", then a polarization value is going to point "c" and data "0" is stored.

When the voltage is applied to the ferroelectric capacitor, data writing is carried out by detecting a voltage variation on the bit line. That is, if positive voltage is applied to the capacitor, in case the data is "0", the charge variation of $\Delta Q_1$ is detected. That is, the charge variation on the bit line is determined by information stored on the capacitor.

The charge variation due to the remnant polarization of the ferroelectric capacitor changes a voltage level on the bit line. Typically, parasite capacitance "Cb" is existed on the bit line itself. When the transistor is turned on and a memory to be read out is selected, charges as much as of $\Delta Q_1$ or $\Delta Q_0$ are outputted. Bit line voltages "V1" and "V2" are acquired by dividing the $\Delta Q_1$ and the $\Delta Q_0$ with the sum of bit line capacitance (Cb) and ferroelectric capacitor (C) capacitance "Cs" and is given by:

$$V1 = \Delta Q_1/(Cb+Cs)$$

$$V2 = \Delta Q_0/(Cb+Cs)$$

Therefore, the potential on the bit line is varied according to the difference between the data "1" and "0". When the transistor is turned on by applying voltage to the word line, potential on the bit line is changed to the "V1" or the "V0". In order to determine whether potential on the bit line is in a voltage level of "V1" or "V0", a reference voltage (Vref), which is set to a specific voltage level between the voltage levels "V1" and "V0", is used.

$Pb(Zr, Ti)O_3$ (hereinafter, referred to as a PZT) or $SrBi_2(Ta_2, Nb)O_9$ (hereinafter, referred to as an SBTN) and $SrBi_2Ta_2O_9$ (hereinafter, referred to as a SBT) of Bi-layered series thin layer are mainly used as a dielectric material of the FeRAM. The material property of a bottom layer disposed under a ferroelectric layer is important in crystallizing the ferroelectric layer. That is, in the ferroelectric capacitor, the characteristic of the ferroelectric layer is largely affected by the electrode, so the electrode must have a low resistance, a small lattice mismatch between the ferroelectric material and the electrode, a high heat-resistance, a low reactivity, a high diffusion barrier characteristic and a good adhesion between the electrode and a ferroelectric material.

As mentioned in the above, the PZT of Pb-series or the SBT and SBTN having the Bi-layered structure are developed as dielectric materials of the capacitor in the nonvolatile memory device. However, the Pb-series ferroelectric layers are difficult to apply because fatigue, retention and imprint properties, related to the lifetime of device, are inferior. Even if the SBT series has good confidence and properties, compared with the other ferroelectric materials, it is also difficult to apply, since layers, previously formed for a capacitor, are oxidized during the thermal treatment performed over 800° C. to crystallize ferroelectric layers.

Especially, in case using the plug structure for connecting the bottom electrode of the capacitor with the source/drain of the transistor, the plug is oxidized during thermal treatment process for nucleation and grain growth. The prior art, as described in FIG. 1B, the top electrode 19 of the capacitor is connected to the source/drain 14 of the transistor to prevent the oxidation of the plug, however, the prior art has the demerit of device size increasing.

SUMMARY OF THE DISCLOSURE

A ferroelectric memory device having a $(Bi_xLa_y)Ti_3O_{12}$ (hereinafter, referred as a BLT) layer which improves the electric characteristic of the device and that can be crystallized at relative low temperature is disclosed.

A method for manufacturing ferroelectric memory device is also disclosed which comprises: a) forming a first conductive layer for a bottom electrode on a semiconductor substrate; b) forming a $(Bi_xLa_y)Ti_3O_{12}$ ferroelectric layer thereon, wherein 'x' representing atomic concentration of Bi is 3.25 to 3.35 and 'y' representing atomic concentration of La is 0.70 to 0.90; and c) forming a second conductive layer for a top electrode on the $(Bi_xLa_y)Ti_3O_{12}$ ferroelectric layer.

A ferroelectric memory device is also disclosed, which comprises: a semiconductor substrate; a transistor including a gate insulating layer, a gate electrode formed on the semiconductor substrate and a doped region formed in the semiconductor substrate of the each end of the gate electrode; a plug contacted to the doped region of the transistor; and a capacitor including a bottom electrode formed on the plug, a $(Bi_xLa_y)Ti_3O_{12}$ ferroelectric layer formed on the bottom electrode and top electrode formed on the ferroelectric layer.

BRIEF DESCRIPTION OF THE DRAWINGS

The above and other features of the disclosure will become apparent from the following description of preferred embodiments taken in conjunction with the accompanying drawings, wherein.

DETAILED DESCRIPTION OF THE PRESENTLY PREFERRED EMBODIMENTS

Hereinafter, a ferroelectric random access memory (FeRAM) according to the disclosure will be described in detail referring to the accompanying drawings. Like numbers refer to like elements throughout this description.

The disclosed method is characterized by forming $(Bi_xLa_y)Ti_3O_{12}$ layer as a ferroelectric material of a capacitor, thereby increasing the reliability of a resulting device. Thermal treatment can be performed at temperature ranging from about 500° C. to about 675° C. for crystallization by adjusting composition of Bi and La so that a good electric characteristic of the capacitor may still be achieved.

In the disclosed method of forming a BLT, especially in the $(Bi_xLa_y)Ti_3O_{12}$ layer, the Bi concentration denoted to "x" ranges from about 3.25 to about 3.35 and the La concentration denoted to "y" ranges from about 0.70 to about 0.90.

The BLT layer can be formed by using spin-on deposition, PVD (Physical Vapor Deposition), CVD (Chemical Vapor Deposition), ALD (Atomic Layer Deposition), MOD (Metal Organic Deposition) or PECVD (Plasma Enhanced Chemical Vapor Deposition) techniques.

In case of using the PECVD technique, the deposition temperature ranges from about 400° C. to about 700° C.

In case of using the spin-on deposition technique, BLT material of liquid state is coated and a first baking process is performed at temperature ranging from about 100° C. to about 200° C. in order to remove solvent contained in the BLT material. Thereafter, a second baking process is performed at temperature ranging from about 200° C. to about 350° C. so as to remove organic matter.

After depositing the BLT layer, a rapid thermal annealing is performed for nucleation at a temperature ranging from about 400° C. to about 800° C. by increasing the temperature at rate of about 50° C./sec to 300° C./sec in an ambient atmosphere of $O_2$ and $N_2$, $N_2$, $NH_3$, $O_2$ or $N_2O$ and a furnace thermal treatment is performed for grain growth at temperature ranging from about 500° C. to about 675° C. and at atmospheric pressure in the ambient atmosphere of $O_2$ and $N_2$, $O_2$ or $N_2O$ gas.

Hereinafter, a first embodiment will be described in detail referring to FIGS. 3A to 3D.

Figure 1A:
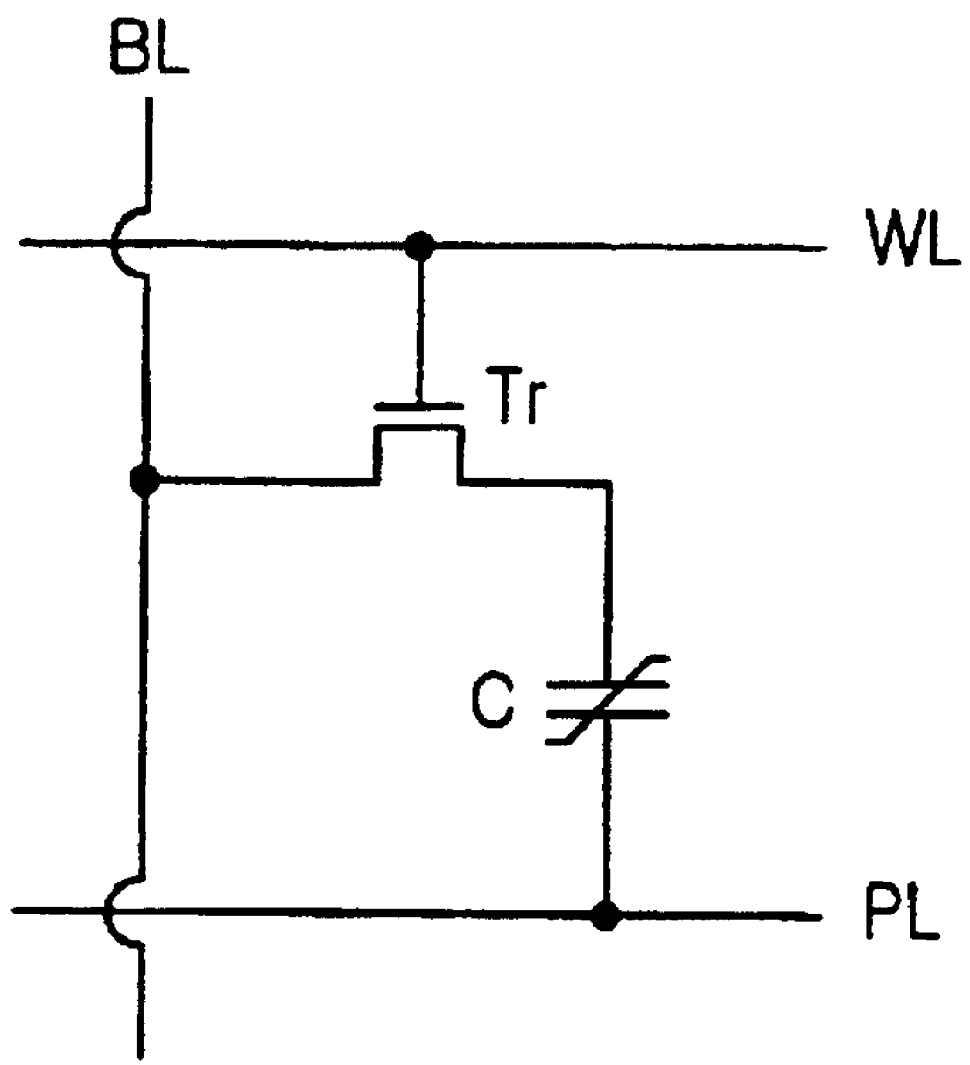
FIG. 1A is a circuit diagram of a prior art FeRAM cell having one transistor and one ferroelectric capacitor.
Figure 1B:
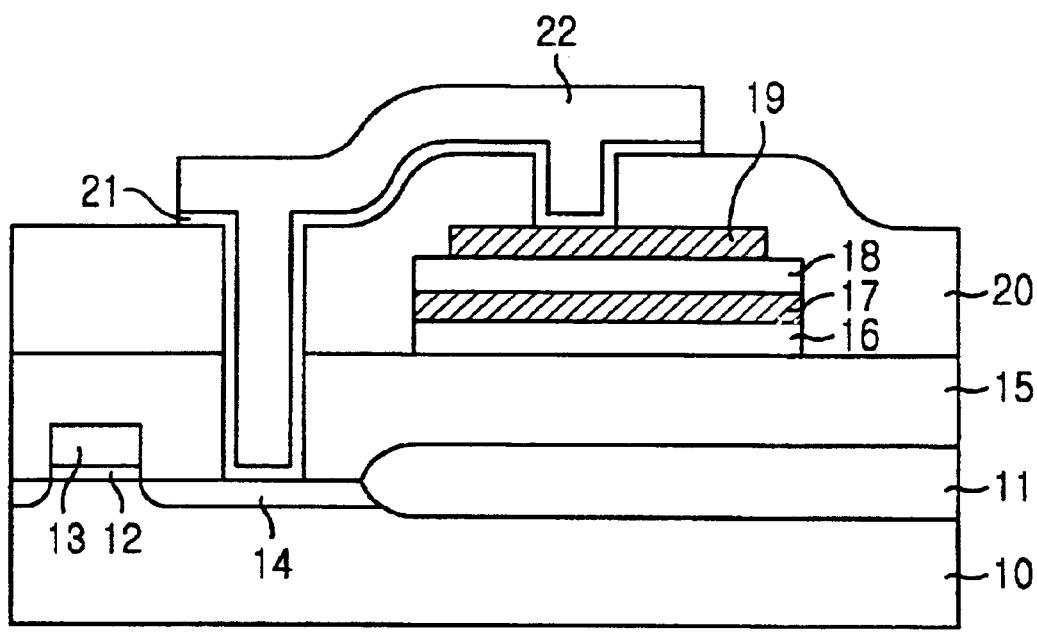
FIG. 1B is a cross-sectional view showing a conventional prior art FeRAM device.
Figure 2:
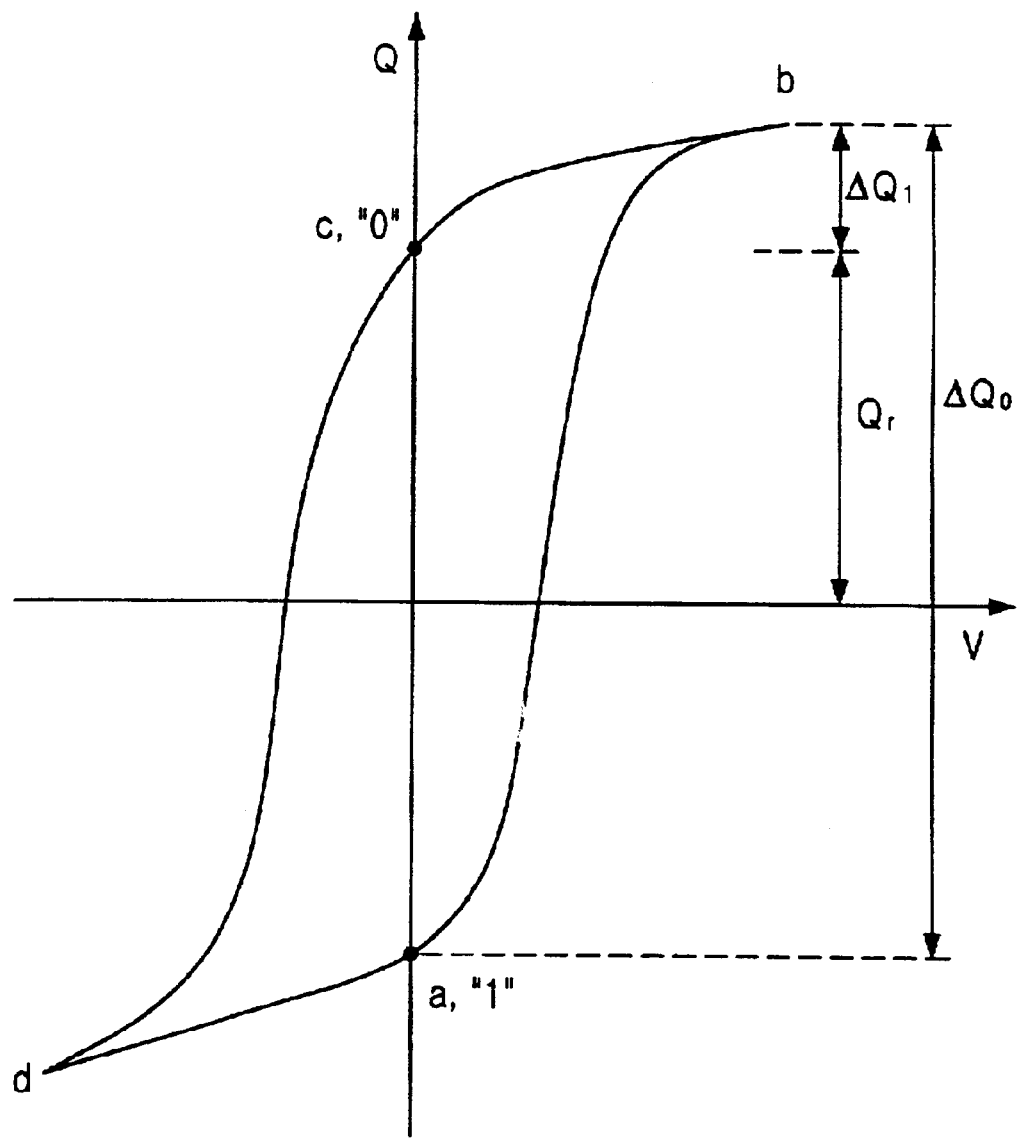
FIG. 2 is a hysteresis loop showing a hysteresis characteristic of a prior art ferroelectric material.
Figure 3A:
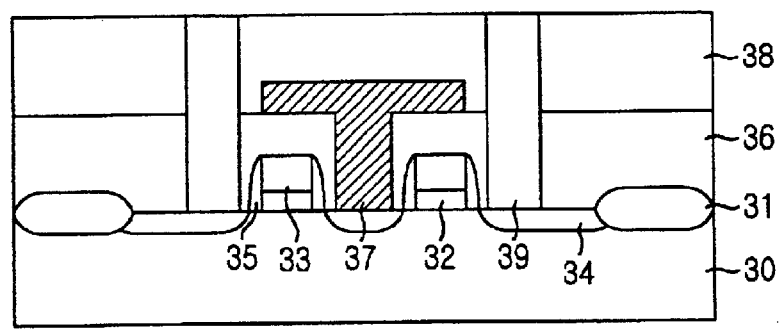
FIGS. 3A to 3D are cross-sectional views showing a FeRAM in accordance with a first embodiment of the disclosure.

Referring to FIG. 3A, a semiconductor substrate 30 including a field oxide layer 31 and a transistor having a gate insulating layer 32, a gate electrode 33, source/drain 34 and an insulating spacer 35 is provided. A first contact hole is formed in order to expose the source/drain 34 by selectively etching a first interlayer insulating layer 36 formed over the semiconductor substrate 30. A bit line, which is contacted to the source/drain 34 through the first contact hole, is formed. A second interlayer insulating layer 38 is formed over the entire structure and a second contact hole is formed for exposing the source/drain 34 by selectively etching the first interlayer insulating layer 36 and second interlayer insulating layer 38. A plug 39 is formed in the second contact hole.

Figure 3B:
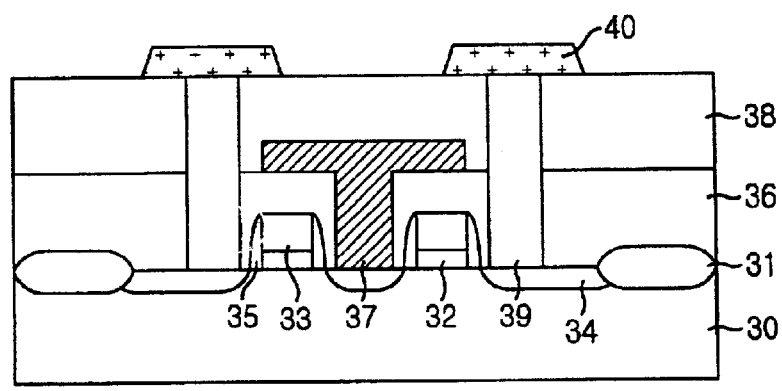

Referring to FIG. 3B, a bottom electrode 40 is formed on the plug 39 by depositing Pt, Ir, $TrO_x$, Ru, RuO, LSCO (La, Sr, Co, O) or YBCO (Y, Ba, Co, O) to a thickness ranging from about 500 Å to about 3000 Å by using deposition technique, such as the MOCVD (Metal Organic Chemical Vapor Deposition), the PVD, the spinon deposition, PECVD and so on. A Ti silicide layer and a TiN barrier metal layer can be deposited for forming Ohmic contact between the plug 39 and the bottom electrode 40.

Figure 3C:
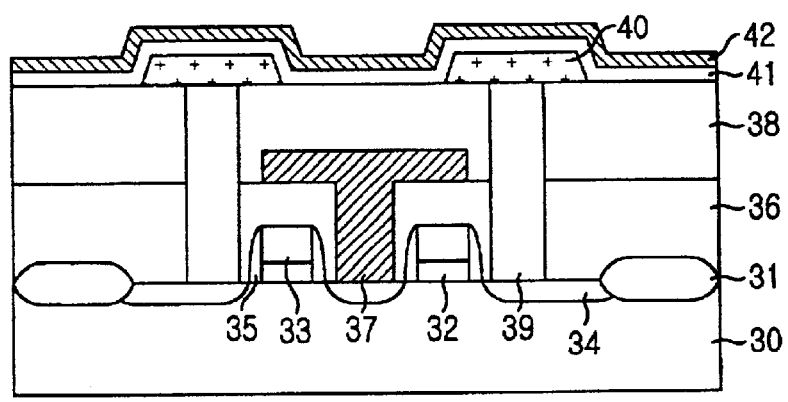
Figure 3D:
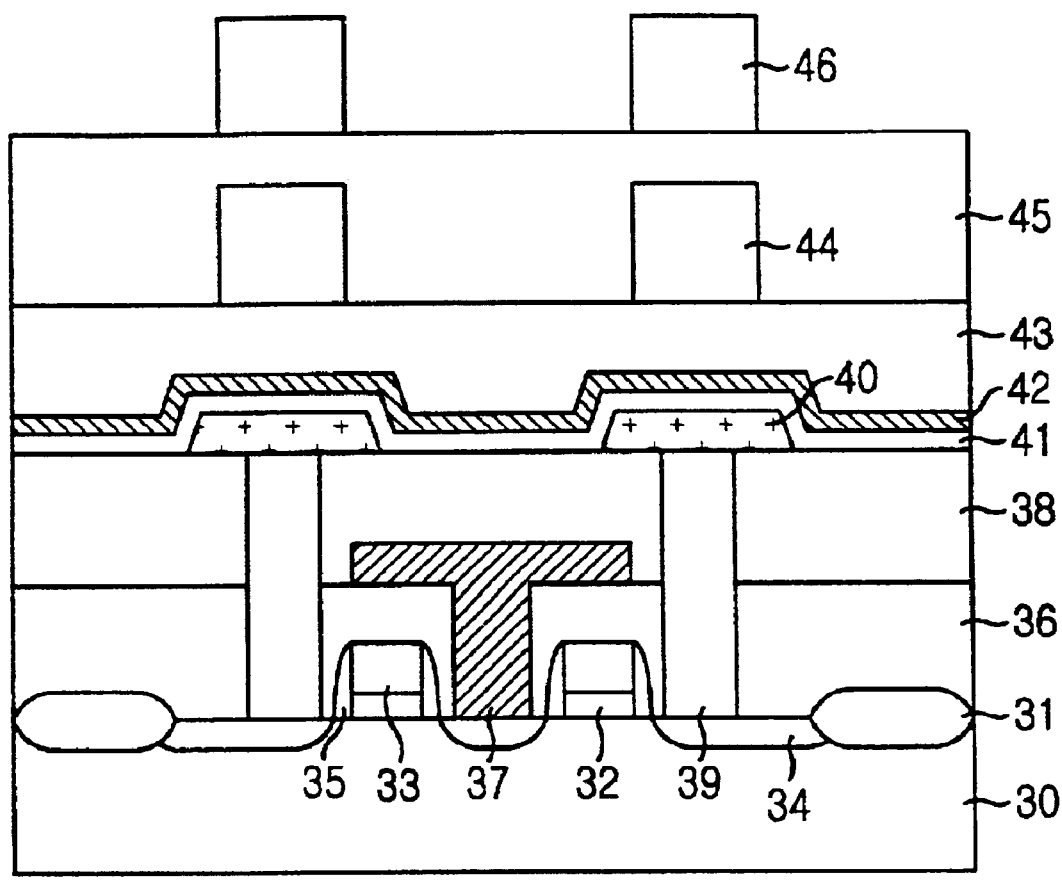

Referring to FIG. 3C, BLT layer 41 is formed on the bottom electrode 40 and a top electrode 42 is formed on the BLT layer 41.

A third interlayer insulating layer 43 is formed over entire structure, including the ferroelectric capacitor, and a first metal wire 44, an inter-metal insulating layer 45 and a second metal wire 46 are formed, in this order, on the third interlayer insulating layer 43.

Thereafter, following processes for forming the FeRAM are performed.

Figure 4:
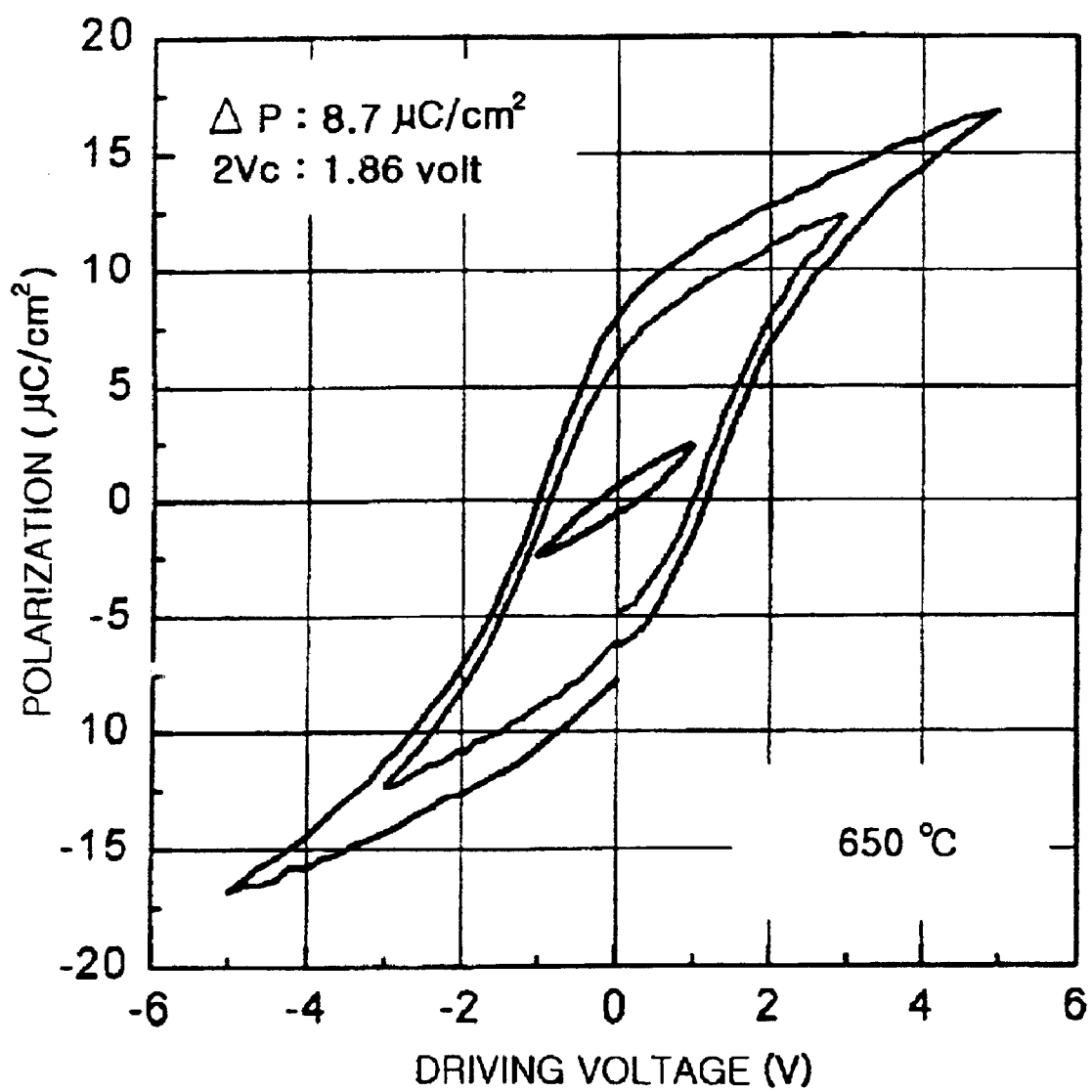
FIG. 4 is a graph showing a polarization characteristic of a FeRAM according to the disclosure.

FIG. 4 is a diagram showing a polarization characteristic of the ferroelectric capacitor formed according to the first embodiment of the present invention. FIG. 4 shows the good polarization characteristic of the ferroelectric capacitor having the BLT layer as the ferroelectric material.

It is possible to obtain good characteristic of polarization and leakage current, when the thermal treatment for crystallizing the BLT layer is performed at temperature of about 650° C. after forming the BLT layer on the bottom electrode formed with metal such as Pt.

However, in such case, the plug 39 beneath the bottom electrode 40 is oxidized, if the thermal treatment performed in the ambient of oxygen. If the Ti silicide or the barrier metal layer is formed between the plug 39 and the bottom electrode 40, the Ti silicide or the barrier metal layer is oxidized so that an interface separation is heavily generated. On the other hand, if the bottom electrode 40 is formed with conductive oxide, such as $TrO_x$, $RuO_x$ or the like, oxygen diffusion is effectively protected at temperature of over 650 C. But the polarization characteristic of the BLT layer formed on the conductive oxide is worse than that of the BLT layer formed on the metal.

A second embodiment solves the above the problem. In the second embodiment, the bottom electrode gas the structure of stacked layers comprising a conductive oxide layer and a metal layer to be contacted with the BLT layer. Thereby, the prevention of the oxide diffusion and the improvement of the characteristics of polarization and leakage current may be obtained.

Hereinafter, the second embodiment of the present invention will be described in detail referring to FIGS. 5A to 5D.

Figure 5A:
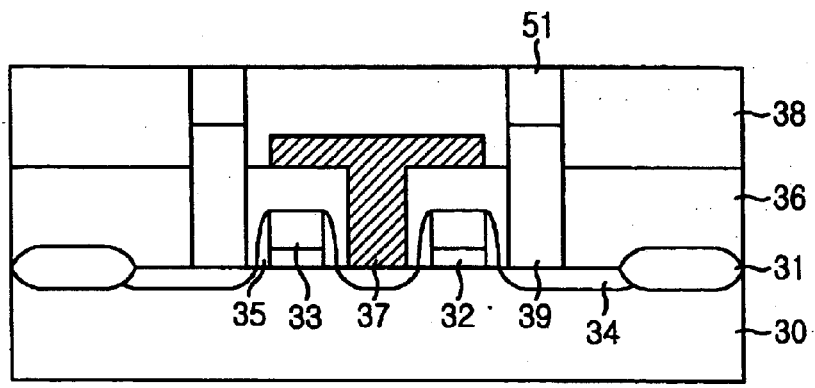
FIGS. 5A to 5D are cross-sectional views showing a FeRAM in accordance with a second embodiment of the disclosure.

Referring to FIG. 5A, a semiconductor substrate 30 including a field oxide layer and a transistor having a gate insulating layer 32, a gate electrode 33 and source/drain 34 is provided. A first contact hole is formed for exposing the source/drain 34 by selectively etching a first interlayer insulating layer 36 which is formed on the semiconductor substrate 30. A bit line 37 which is contacted to the source/drain 34 through the first contact hole is formed and a second interlayer insulating layer 38 is formed on the entire structure. A second contact hole exposing the source/drain 34 is formed by selectively etching the second interlayer insulating layer 38 and the first interlayer insulating layer 36 and a plug 39 is formed in the second contact hole. To form an Ohmic contact, a Ti silicide layer or a TiN diffusion barrier layer 51 is deposited on the plug 39 in the second contact, and a CMP (Chemical Mechanical Polishing) is performed to separate the Ti silicide layer or the TiN diffusion barrier layer 51 on the adjacent plugs 39. The silicide layer or a TiN diffusion barrier 51 is deposited by using CVD to obtain good step coverage.

Figure 5B:
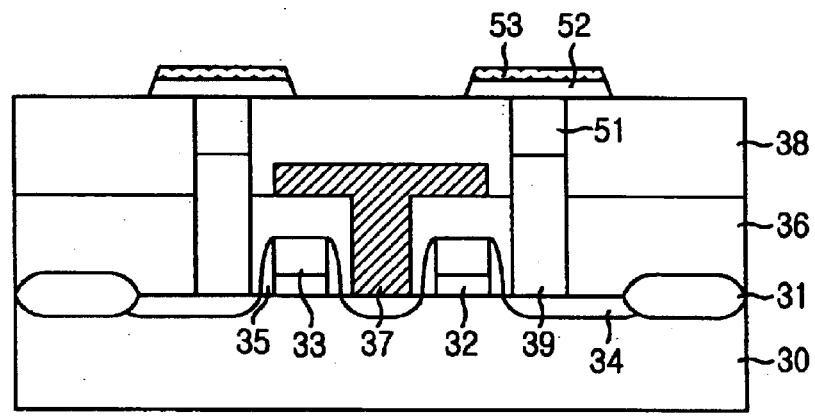

Referring to FIG. 5B, a first bottom electrode 52 is formed by depositing conductive oxide, such as $IrO_x$ or $RuO_x$, to a thickness of 50 Å to 2950 Å on the plug 39. A second bottom electrode 53 is formed with metal layer, such as Pt, Ru, Ir, W, WN or the like, to a thickness ranging from about 50 Å to about 2950 Å on the first bottom electrode 52. The first bottom electrode 52 and the second electrode 53 are formed by using various deposition technique, such as CVD, PVD, spin-on, ALD (Atomic Layer deposition) or the like, and the total thickness of the bottom electrode ranges from about 100 Å to about 3000 Å.

Figure 5C:
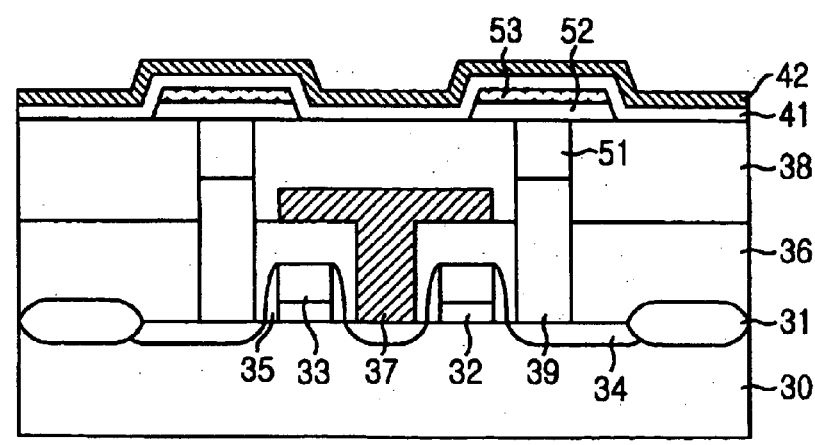
Figure 5D:
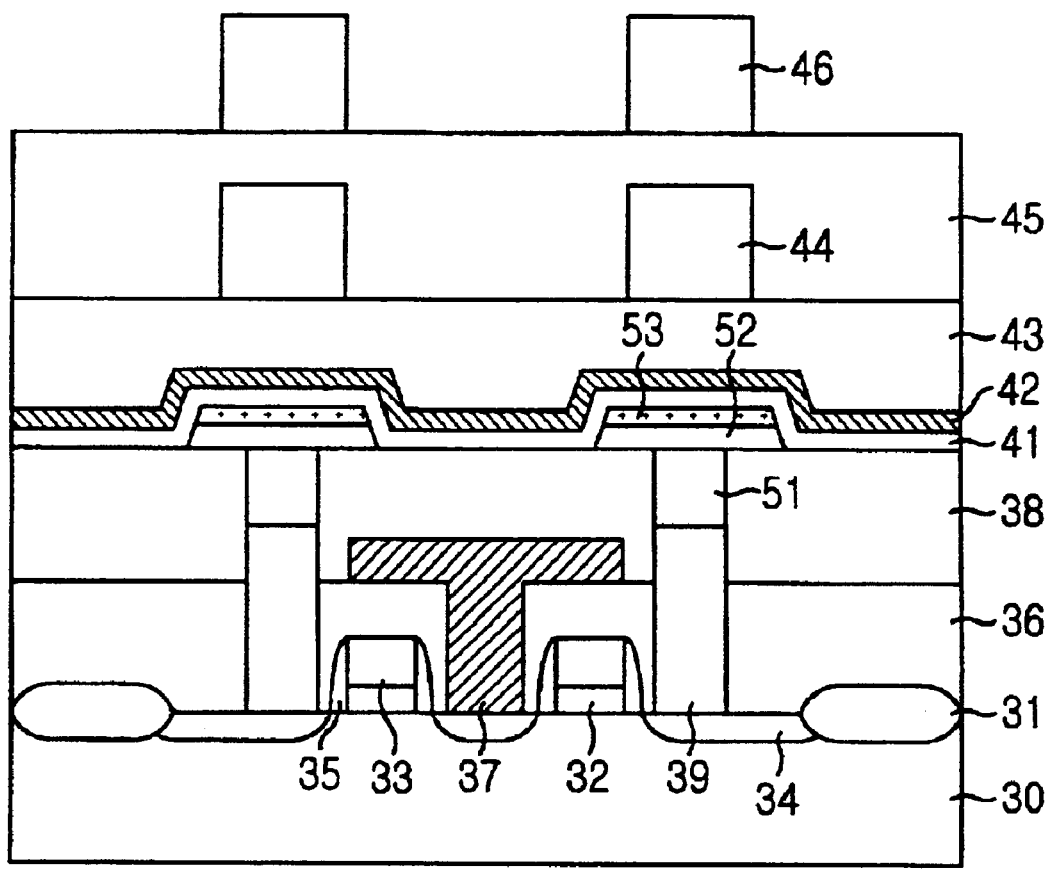

Referring to FIG. 5C, a BLT layer 41 is formed on the second electrode 53 and a top electrode 42 is formed on the BLT layer 41. When a crystal direction of the BLT layer is aligned to c-axis, that is, parallel with the substrate, the polarization value is about 4 $\mu C/cm^2$. When the crystal direction of the BLT layer is aligned to a-b axis, that is, when the angle between the crystal direction and the substrate direction changes from about 0° to about 90°, the polarization value is about 50 $\mu C/cm^2$. In conclusion, the polarization value may change to over 10 times in accordance with the direction of alignment.

The crystal direction of the BLT layer, formed on a metal layer mostly aligned to the c-axis, so that the value of the polarization is decreased. A third embodiment provides a method for forming FeRAM to solve the above mentioned problem. A ferroelectric capacitor having a bottom electrode, a BLT ferroelectric layer and a top electrode are formed on a semiconductor substrate and thereby the side of the BLT ferroelectric layer is exposed. The thermal treatment is performed to align the crystal direction of side of the BLT ferroelectric layer to the a-b axis. That is, the angle between the crystal direction of the side of the BLT ferroelectric layer and the semiconductor substrate becomes from 0° to 90°. Thereby the polarization value on side of the BLT ferroelectric layer is increased.

The third embodiment is described in detail referring to FIGS. 6A to 6E and FIG. 7.

Figure 6A:
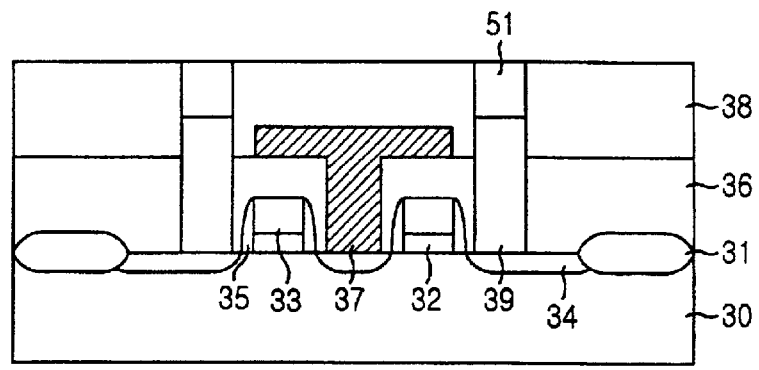
FIGS. 6A to 6E are cross-sectional views showing a FeRAM in accordance with a third embodiment of the disclosure.

Referring to FIG. 6A, a semiconductor substrate 30 including a field oxide layer 31 and a transistor having a gate insulating layer 32, a gate electrode 33 and source/drain 34 is provided. A first contact hole is formed for exposing the source/drain 34 by selectively etching a first interlayer insulating layer 36 which is formed on the semiconductor substrate 30. A bit line 37 which is contacted with the source/drain 34 through the first contact hole is formed and a second interlayer insulating layer 38 is formed on the entire structure. A second contact hole exposing the source/drain 34 is formed by selectively etching the second interlayer insulating layer 38 and the first interlayer insulating layer 36 for exposing the source/drain 34 and a plug 39 is formed in the second contact hole. To form an Ohmic contact, a Ti silicide layer or a TiN diffusion barrier layer 51 is deposited on the plug 39 in the second contact hole, and a CMP is performed to separate the Ti silicide layer or the TiN diffusion barrier layer 51 on the adjacent plugs 39. The silicide layer or a TiN diffusion barrier 51 is deposited by using CVD technique to obtain good step coverage.

Figure 6B:
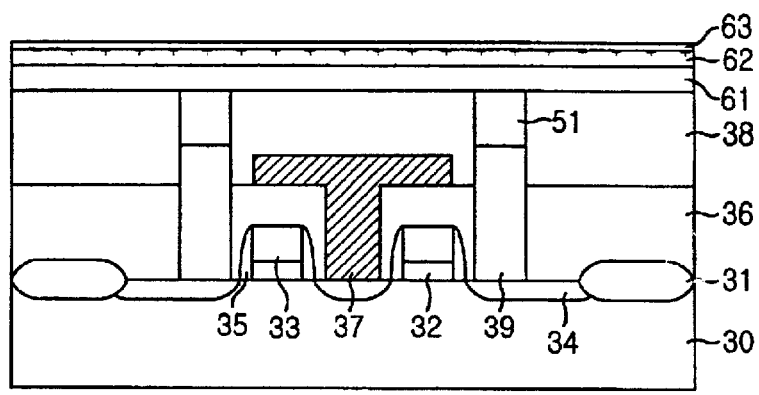

Referring to FIG. 6B, a conductive oxide layer 61, such as $IrO_x$, $RuO_x$ or the like, is formed on the plug 39 and a metal layer 62, such as Pt, is deposited on the conductive oxide layer 61 by using the CVD technique. As mentioned in the above, a BLT layer is formed on the metal layer 62. In the preferred embodiment of the present invention, the bottom electrode is formed with the stacked conductive layers comprising oxide layer 61 and the metal layer 62, such as $Pt/IrO_x$, $Pt/RuO_x$ or the like. Also, the bottom electrode can be formed with a single layer by using Pt, Ru, Ir, $RuO_x$, W, WN or the like. Also, the total thickness forming the conductive layer of the bottom electrode ranges from about 500 Å to about 3000 Å.

Figure 6C:
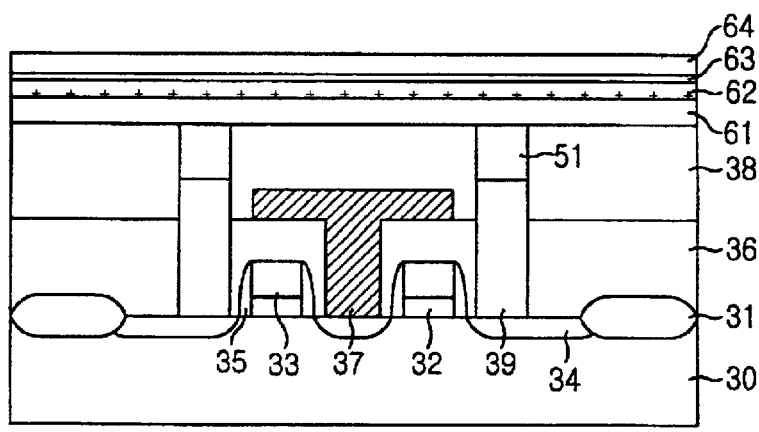

Referring to FIG. 6C, a conductive layer 64 for forming a top electrode is formed on the BLT layer 63.

Figure 6D:
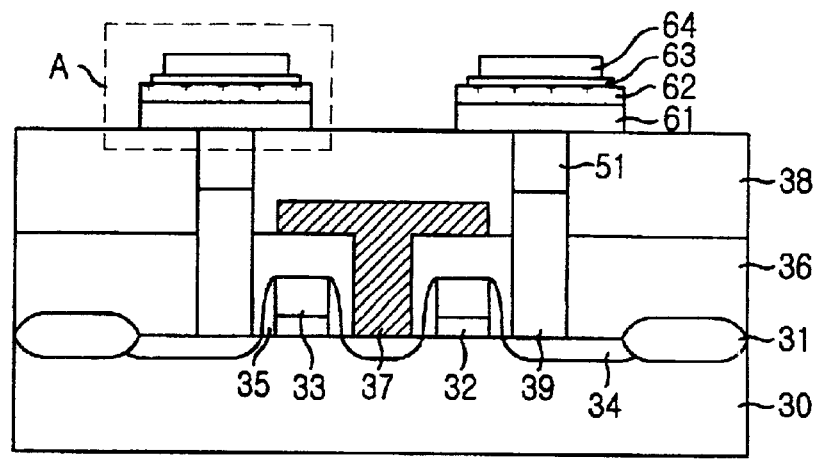

Referring to FIG. 6D, a ferroelectric capacitor pattern is formed by selectively etching the conductive layer 64, the BLT layer 63, the metal layer 62 and the conductive oxide layer 61. The side of the BLT layer 63 is exposed according to formation of the ferroelectric capacitor pattern. A rapid thermal annealing is performed at temperature ranging from about 500° C. to about 800° C. by increasing temperature at a rate ranging from about 50° C./sec to about 300° C./sec in the ambient atmosphere of $O_2$, $N_2O$, $H_2O_2$, $H_2O$, $N_2$, Ar or Ne gas so that the crystal direction of the side of the BLT layer 63 is aligned to a-b axis. That is, the angle between the crystal direction of the side of the BLT layer 63 and the bottom and top electrode, which are parallel to the semiconductor substrate 30, is changed from about 0° to about 90°. Next, a furnace thermal treatment is performed at temperature of 500° C. to 800° C. for relaxation and removing a plasma damage generated by a plasma during the etching process for forming a ferroelectric capacitor pattern.

Figure 7:
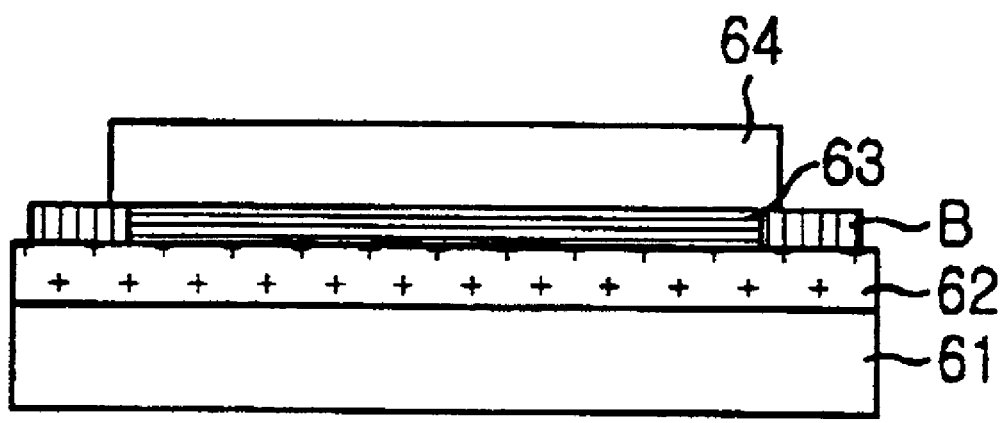
FIG. 7 is a diagram magnifying section "A" of FIG. 6D.

FIG. 7 is a diagram magnifying the "A" in FIG. 6D. The crystal direction of the central part of the BLT layer 63, mostly aligned to c-axis, and the crystal direction of the side "B" of the BLT layer 63 aligned to a-b axis by the rapid thermal annealing are shown.

Figure 6E:
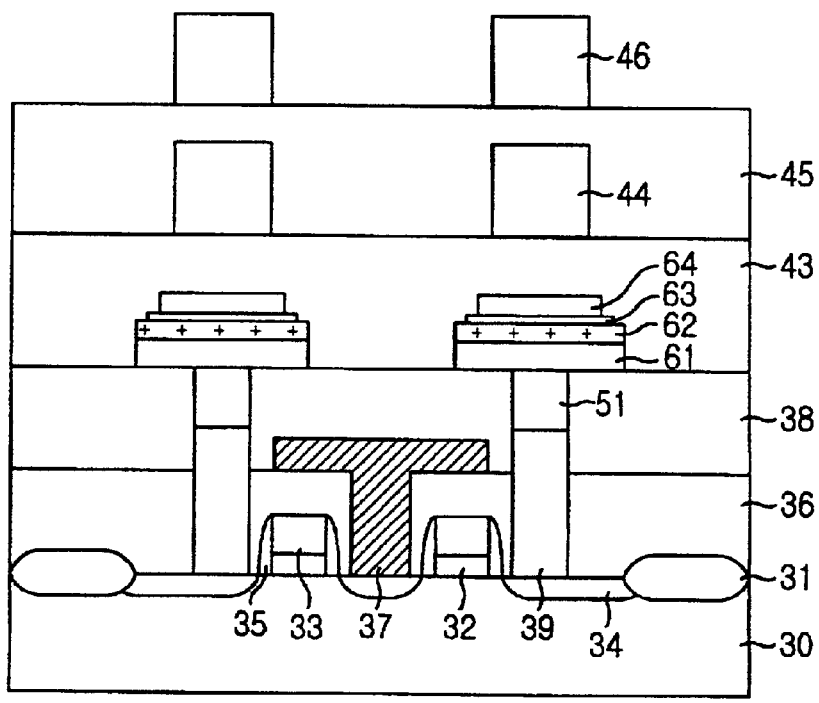

Referring to FIG. 6E, a third interlayer insulating layer 43 is formed over the entire structure including the ferroelectric capacitor and a first metal wire 44, inter-metal insulating layer 45 and a second metal wire 46 are formed in this order on the third interlayer insulating layer 43. Thereafter, following processes for forming the FeRAM are performed.

Figure 8:
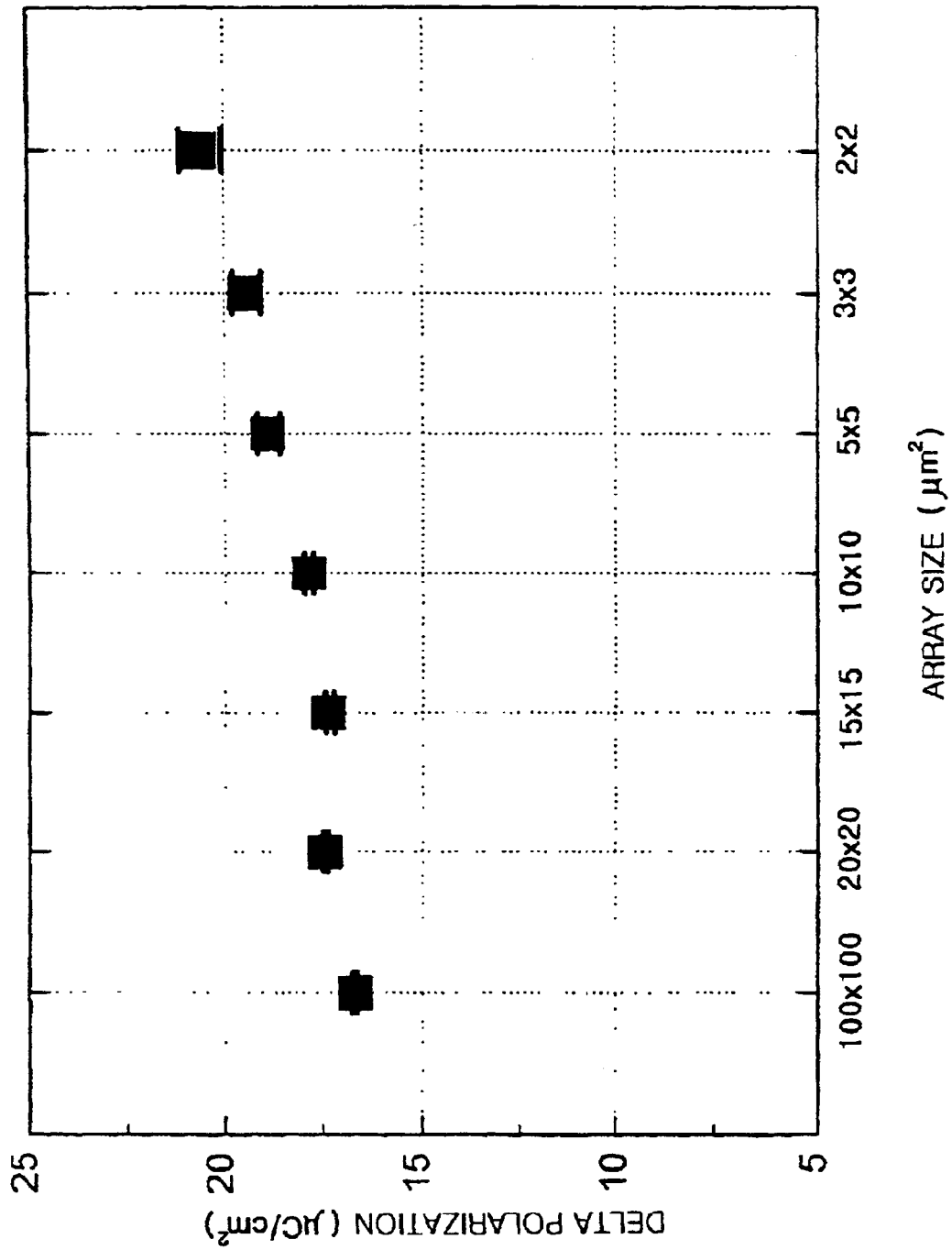
FIG. 8 is a graph showing a cell size dependency of delta polarization in ferroelectric capacitor according to the disclosure.

FIG. 8 is a graph showing a cell size dependency of delta polarization in ferroelectric capacitor. As integration of the FeRAM device, equal to DRAM, is improved, a capacitor size is getting smaller so that a polarization value is decreased by damages of a domain and a grain boundary and edge effect. However, as a polarization value is partially increased by changing the crystal direction of side of the BLT ferroelectric layer after forming a capacitor pattern, the decrease of a capacitor polarization value, which is caused by the decrease of a cell array size, is protected.

Accordingly, a high electric characteristic of the ferroelectric capacitor may be achieved, because the thermal treatment process for crystallizing the BLT ferroelectric layer can be performed at temperature ranging from about 500° C. to about 675° C. by adjusting the concentration of Bi and La.

The characteristics of the polarization, the leakage current and the prevention of the oxide diffusion may be improved by forming the BLT layer on the metal layer, such as Pt, formed on the conductive oxide layer, such as $RuO_x$, $IrO_x$, or the like.

The polarization value of the BLT ferroelectric layer may be increased by aligning the crystal direction of the side of BLT ferroelectric layer to the a-b axis. The alignment can be obtained by exposing and annealing the side of the BLT ferroelectric layer formed between the bottom electrode and the top electrode.

While the disclosed concepts have been described with respect to the particular embodiments, it will be apparent to those skilled in the art that various changes and modifications may be made without departing from the spirit and scope of the disclosure as defined in the following claims.

What is claimed is:

1. A method for manufacturing ferroelectric memory device, comprising:

a) forming a first conductive layer for a bottom electrode on a semiconductor substrate;
   b) forming a $(Bi_xLa_y)Ti_3O_{12}$ ferroelectric layer, wherein 'x' representing atomic concentration of Bi ranging from about 3.25 to about 3.35 and 'y' representing atomic concentration of La ranges from about 0.70 to about 0.90;
   c) forming a second conductive layer for a top electrode on the $(Bi_xLa_y)Ti_3O_{12}$ ferroelectric layer; and
   d) performing a thermal treatment to align a crystal direction on a side of the $(Bi_xLa_y)Ti_3O_{12}$ ferroelectric layer, wherein an angle between the crystal direction and a direction of the bottom and ton electrodes is about 90°.

2. The method as recited in claim 1, wherein the step a) further comprises:

a1) further forming a conductive oxide layer with $IrO_x$ or $RuO_x$; and
   a2) forming a metal layer selected from the group consisting of Pt, Ru, Ir, W and WN on the conductive oxide layer.

3. The method recited in claim 2, wherein the step b) comprises:

b1) forming the $(Bi_xLa_y)Ti_3O_{12}$ ferroelectric layer on the first conductive layer;
   b2) performing a thermal treatment for nucleation at temperature ranging from about 400° C. to about 800° C.; and
   b3) performing a thermal treatment for crystallization of the $(Bi_xLa_y)Ti_3O_{12}$ ferroelectric layer at temperature ranging from about 500° C. to about 675° C.

4. The method as recited in claim 3, wherein the $(Bi_xLa_y)Ti_3O_{12}$ ferroelectric layer is formed by a technique selected from the group consisting of spin-on, PVD (Physical Vapor Deposition), CVD (Chemical Vapor Deposition), ALD (Atomic Layer Deposition), MOD (Metal Organic Deposition) or PECVD (Plasma Enhanced Chemical Vapor Deposition).

5. The method as recited in claim 3, wherein the $(Bi_xLa_y)Ti_3O_{12}$ ferroelectric layer is formed by the PECVD technique at a temperature ranging from about 400° C. to about 700° C.

6. The method as recited in claim 3, wherein the step b1) comprises:

b4) forming a $(Bi_xLa_y)Ti_3O_{12}$ material of liquid state on the substrate using the spin-on technique;
   b5) removing solvent contained in the $(Bi_xLa_y)Ti_3O_{12}$ material by a thermal treatment at temperature ranging from about 100° C. to 200° C.; and
   b6) removing organic matter contained in the $(Bi_xLa_y)Ti_3O_{12}$ material by a thermal treatment at temperature ranging from about 200° C. to about 350° C.

7. The method as recited in claim 3, rein the thermal treatment for nucleation is performed by increasing temperature at speed ranging from about 50° C./sec to about 300° C./sec in an ambient atmosphere selected from the group consisting of $N_2$, $NH_3$, $O_2$, $N_2O$ and mixed $O_2$ and $N_2$.

8. The method as recited in claim 3, wherein the thermal treatment for crystallization of the $(Bi_xLa_y)Ti_3O_{12}$ ferroelectric layer is performed at an atmospheric pressure condition in an ambient atmosphere selected from the group consisting of $O_2$, $N_2O$ and mixed $O_2$ and $N_2$.

9. A ferroelectric memory device, comprising:

a semiconductor substrate;
   a transistor comprising a gate insulating layer, a gate electrode formed on the semiconductor substrate and a doped region formed in the semiconductor substrate at an end of the gate electrode;

a plug engaging to the doped region of the transistor;

a capacitor including a bottom electrode formed on the plug, a $(Bi_xLa_y)Ti_3O_{12}$ ferroelectric layer formed on the bottom electrode and a top electrode formed on the ferroelectric layer; and wherein an angle between a crystal direction on a side of the $(Bi_xLa_y)Ti_3O_{12}$ ferroelectric layer and the bottom and top electrodes is about 90°.

10. The ferroelectric memory device as recited in claim 9, wherein 'x' representing atomic concentration of Bi ranges from about 3.25 to about 3.35 and 'y' representing atomic concentration of La ranges from about 0.70 to about 0.90.

11. The ferroelectric memory device as recited in claim 9, wherein the bottom electrode comprises:

a first bottom electrode formed with a conductive oxide layer on the plug; and a second bottom electrode formed with a metal layer on the first bottom electrode.

12. The ferroelectric memory device as recited in claim 9, wherein the first bottom electrode is formed with $IrO_x$ or $RuO_x$.

13. The ferroelectric memory device as recited in claim 9, wherein the second bottom electrode is formed with a material selected from the group consisting of Pt, Ru, Ir, W and WN.

14. The ferroelectric memory device as recited in claim 9, wherein the device further comprises an Ohmic contact layer and a barrier metal layer between the plug and the bottom electrode.

15. A method for manufacturing ferroelectric memory device, comprising:

a) forming a first conductive layer for a bottom electrode on a semiconductor substrate;

b) forming a $(Bi_xLa_y)Ti_3O_{12}$ ferroelectric layer, wherein 'x' representing atomic concentration of Bi ranges from about 3.25 to about 3.35 and 'y' representing atomic concentration of La ranges from about 0.70 to about 0.90;

c) forming a second conductive layer for a top electrode on the $(Bi_xLa_y)Ti_3O_{12}$ ferroelectric layer;

d) patterning the second conductive layer, the $(Bi_xLa_y)Ti_3O_{12}$ ferroelectric layer and the first conductive layer, wherein the edge of the $(Bi_xLa_y)Ti_3O_{12}$ ferroelectric layer is exposed;

e) performing a thermal treatment to align a crystal direction on the side of the $(Bi_xLa_y)Ti_3O_{12}$ ferroelectric layer, wherein an angle between a crystal direction and the bottom and top electrodes ranges is about 90°.

16. The method recited in claim 15, wherein the step comprises:

b1) forming the $(Bi_xLa_y)Ti_3O_{12}$ ferroelectric layer on the first conductive layer;

b2) performing a thermal treatment for nucleation at temperature ranging from about 400° C. to about 800° C.; and b3) performing a thermal treatment for crystallization of the $(Bi_xLa_y)Ti_3O_{12}$ ferroelectric layer at temperature ranging from about 500° C. to about 675° C.

17. The method as recited in claim 16, wherein the $(Bi_xLa_y)Ti_3O_{12}$ ferroelectric layer is formed by the PECVD technique at a temperature ranging from about 400° C. to about 700° C.

18. The method as recited in claim 16, wherein the step b1) comprises:

b4) forming a $(Bi_xLa_y)Ti_3O_{12}$ material of liquid state on the substrate using a spin-on technique;

b5) removing solvent contained in the $(Bi_xLa_y)Ti_3O_{12}$ material by a thermal treatment at temperature ranging from about 100° C. to about 200° C.; and b6) removing organic matter contained in the $(Bi_xLa_y)Ti_3O_{12}$ material by a thermal treatment at temperature ranging from about 200° C. to about 350° C.

* * * * *

UNITED STATES PATENT AND TRADEMARK OFFICE
CERTIFICATE OF CORRECTION

PATENT NO. : 6,747,302 B2  Page 1 of 1
DATED : June 8, 2004
INVENTOR(S) : Nam-Kyeong Kim et al.

It is certified that error appears in the above-identified patent and that said Letters Patent is hereby corrected as shown below:

Title page,
Item [75], Inventors, please delete "Seoul" in all three instance and replace with
-- Kyoungki-do --.
Item [73], Assignee, please delete "Kyoungbki-di" and replace with -- Kyoungki-do --.

Column 8,
Line 13, please delete "ton" and replace with -- top --.
Line 17, please delete "$IrO_x$" and replace with -- $Ir_x$ --.
Line 54, please delete "rein" and replace with -- wherein --.

Column 10,
Line 11, please delete "electrodes ranges is about 90º." and replace with -- electrodes is about 90º. --.

Signed and Sealed this

Twenty-fifth Day of January, 2005

JON W. DUDAS
*Director of the United States Patent and Trademark Office*